United States Patent [19]
Bucholtz et al.

[11] Patent Number: 5,305,075
[45] Date of Patent: Apr. 19, 1994

[54] MAGNETOSTRICTIVE TRANSDUCER SYSTEM HAVING A THREE DUAL-STRIP FIBER OPTIC MAGNETOSTRICTIVE TRANSDUCERS BONDED INTO A SINGLE FIBER MACH-ZEHNDER INTERFEROMETER

[75] Inventors: Frank Bucholtz, Crofton, Md.; Kee P. Koo, Alexandria, Va.; Dominique M. Dagenais, Chevy Chase, Md.

[73] Assignee: The United States of America as represented by the Secretary of the Navy, Washington, D.C.

[21] Appl. No.: 12,140

[22] Filed: Jan. 29, 1993

[51] Int. Cl.$^5$ .................................................. G01B 9/02
[52] U.S. Cl. ................................. 356/345; 250/227.19; 250/227.27; 359/12; 324/244.1
[58] Field of Search .................. 356/345; 250/220.19, 250/227.07; 359/12; 324/244.1, 260, 96

[56] References Cited

U.S. PATENT DOCUMENTS

| H94 | 7/1986 | Koo | 250/227 |
|---|---|---|---|
| H864 | 1/1991 | Bucholtz | 73/800 |
| 4,591,786 | 7/1986 | Koo | 324/244 |
| 4,603,296 | 7/1986 | Koo | 324/244 |
| 4,609,871 | 9/1986 | Bobb | 324/244 |
| 4,850,098 | 7/1989 | Yurek | 29/527.2 |
| 4,881,813 | 11/1989 | Koo | 356/345 |

OTHER PUBLICATIONS

Dagenais et al., "Transducer Design and Testing for Three-Axis Fiber magnetometers", NRL/MR/6570-9-2-6956 (Mar. 1992) pp. 1–56.
Dagenais et al., "A High Resolution Three-Axis Fiber Magnetometer", 8th Optical Fiber Sensors Conference, Conference Proceedings, Monterey, Ca., IEEE Lasers and Electro-Optics Society IEEE Cat No. 92CH3107-0 (Jan. 29–31, 1992) pp. 406–409.
Dagenais et al., "A High Resolution Three-Axis Fiber-Optic Magnetometer" NRL Optical Sciences Division Presentation (Jan. 29, 1992).
"Fiber Optic and Laser Sensors VIII", Proceedings Reprint, Society of Photo–Optical Instrumentation Engineers, vol. 1367, (Sep. 17–19, 1990) pp. 226–235.
Bucholtz et al., "Three-Axis, Optically-Powered Fiber Optic Magnetometer", Conference Proceedings, NRL LEOS Meeting, IEEE Cat. No. 88CH2683-1, (1988) Sec. OS3.2.
Koo et al., "An Analysis of a Fiber Optic Magnetometer with Magnetic Feedback", Journal of Lightwave Technology, vol. LT-5, No. 12, (Dec. 1987) pp. 1680–1685.

(List continued on next page.)

Primary Examiner—Samuel A. Turner
Assistant Examiner—Robert Kim
Attorney, Agent, or Firm—Thomas E. McDonnell; Charles J. Stockstill

[57] ABSTRACT

The fiber-optic magnetostrictive transducer system consists of a sensing element having three dual-strip fiber optic magnetostrictive transducers bonded into a single fiber Mach-Zehnder interferometer operating single mode mounted in a symmetrical orthogonal geometry. The dual-strip fiber optic magnetostrictive transducers have predictable and consistent reproducibility and are comprised of a pair of field annealed metallic glass strips bonded to a coil of optical fiber. This structure is in turn mounted on a bobbin structure where the fiber ribbon is attached to the bobbin only at the two ends of the bobbin. This reduces the possible loading of the transducer due to friction between the optical fiber and the surface of the mounting structure and at the same time provide a long sensing fiber in contact with the magnetostrictive element for high sensitivity. The symmetrical orthogonal arrangement of the transducers minimizes magnetic crosstalk and the strip form of the transducer elements maintain high directional sensitivity.

18 Claims, 4 Drawing Sheets

OTHER PUBLICATIONS

Bucholtz et al., "Low Frequency, Submicrogauss Fiber-Optic Magnetometer," Electronic Letters, vol. 23, No. 19, (Sep. 10, 1987) pp. 985–987.

Kersey et al., "Single-Mode Fiber-Optic Magnetometer with D C Bias Field Stabilization", Journal of Lightwave Technology, vol. LT-3, No. 4 (Aug. 1985) pp. 837–840.

Koo et al., "A Fiber-Optic D C Magnetometer", Journal of Lightwave Technology, vol. LT-1, No. 3, (Sep. 1983) pp. 524–525.

Koo et al., "Characteristics of Fiber-Optic Magnetic-Field Sensors Employing Metallic Glasses", Optics Letters, vol. 7, No. 7, (Jul. 1982) pp. 334–336.

Trowbridg et al., "Metallic-Glass Fiber-Optic Phase Modulators", Optics Letters, vol. 6, No. 12, (Dec. 1981) pp. 636–638.

Jarzynski et al., "Magnetic Field Sensitivity of an Optical Fiber with Magnetostrictive Jacket", Applied Optics, vol. 19, No. 22 (Nov. 15, 1980) pp. 3746–3748.

Yariv et al., "Proposal for Detection of Magnetic Fields Through Megnetostrictive Perturbation of Optical Fibers," Optics Letters, vol. 5, No. 3, (Mar. 1980) pp. 87–89.

DePaula et al., "Fiber Optic and Laser Sensors IV", Proc. SPIE, vol. 718, (Sep. 1986) pp. 128–133.

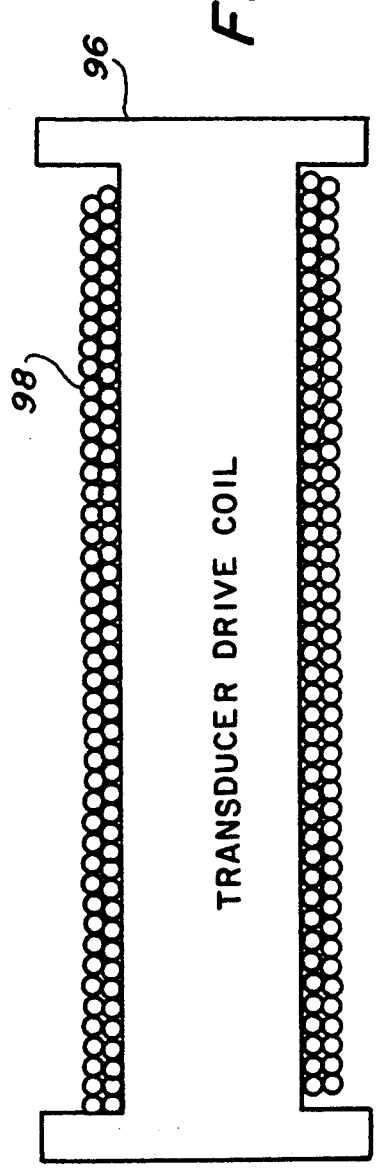
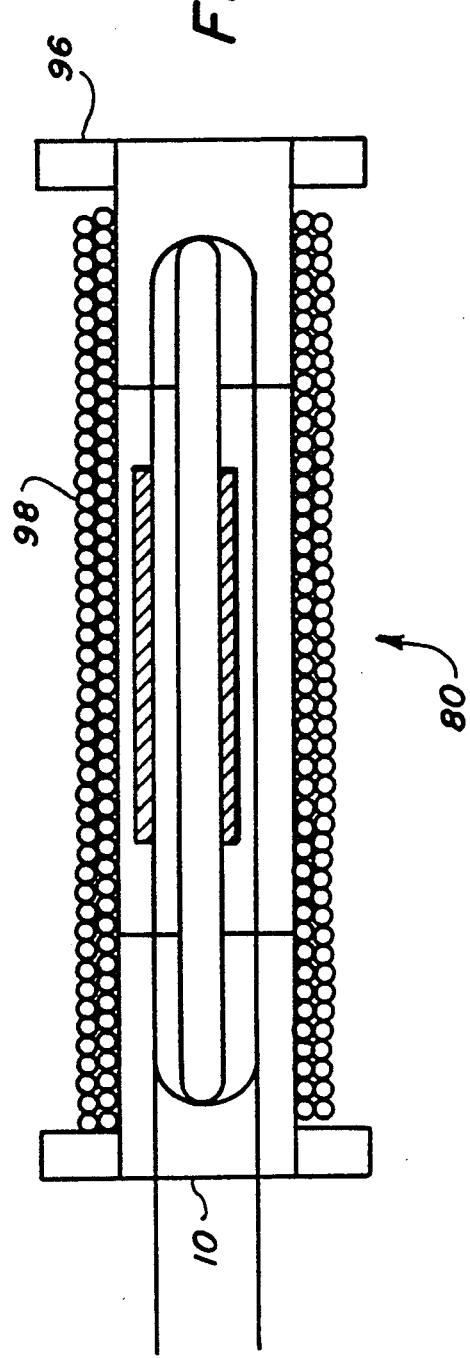

MAGNETOSTRICTIVE TRANSDUCER SYSTEM HAVING A THREE DUAL-STRIP FIBER OPTIC MAGNETOSTRICTIVE TRANSDUCERS BONDED INTO A SINGLE FIBER MACH-ZEHNDER INTERFEROMETER

BACKGROUND OF THE INVENTION

1. Field of the Invention

This invention encompasses a dual-strip fiber optic magnetostrictive transducer that is used to detect small changes in magnetic field and a three-axis fiber optic magnetostrictive transducer system utilizing the device.

2. Description of Related Art

A magnetostrictive transducer was first proposed in 1979 that incorporated a fiber with a magnetostrictive jacket in an interferometer. Further work produced a variety of transducer shapes and materials, some using jacketed fibers and others simply using fiber bonded to a sample. Later, inexpensive, extremely soft magnetically, amorphous Fe-B alloys became available in long, thin ribbons with magneto-mechanical properties that could be manipulated by annealing. A short strip of the ribbon could easily be bonded directly to the fiber to form a transducer. With straightforward electronic closed-loop techniques, the effects of hysteresis could effectively be suppressed and allowed stable operation with a large dynamic range.

Cylindrical transducers which incorporated tens of meters of fiber achieved a hundred-fold increase in responsivity compared with the strip samples and provided good low-frequency resolution. The nonlinear magnetostriction allowed a number of transducers to be multiplexed on a single interferometer in a way not possible with standard, linear transducers. However, with cylindrical transducers directivity and crosstalk were degraded.

Another method for utilizing magnetostrictive transducer technology is the use of flat metallic strips bonded to an optical fiber. Because of the ill-defined mechanical boundaries of magnetic strips, it is difficult to obtain and maintain a given frequency response repeatedly, in contrast to cylinders that exhibit a well-defined resonance. The metallic strip transducers are more compact than cylindrical transducers but are less sensitive because of this fact.

SUMMARY OF THE INVENTION

The object of this invention is to provide a transducer system where the individual transducers are constructed having a long length of sensing fiber without being large and bulky.

Another objective is to provide a transducer system where the individual transducers are capable of being manufactured with predictable frequency response and high sensitivity.

The dual-strip fiber optic magnetostrictive transducer is constructed by bonding two transversely field-annealed magnetostrictive metallic glass strips to a length of single mode optical fiber which is in the form of a loop of optical fiber ribbon. This structure is in turn mounted on a beam or bobbin structure where the fiber ribbon is attached to the bobbin only at the two ends. This technique reduces the possible loading of the transducer due to friction between the optical fiber and the surface of the mounting structure.

The design of the dual-strip fiber optic magnetostrictive transducer produces a transducer that can be manufactured with predictable frequency response and high sensitivity.

The fiber optic magnetostrictive transducer system consists of a sensing element having three dual-strip fiber optic magnetostrictive transducers, each transducer being mounted along orthogonal axes mounted in a single fiber optic Mach-Zehnder interferometer operating single mode to form a vector magnetometer capable of measuring the magnetic field along three orthogonal axes. The output of the Mach-Zehnder interferometer passes through a pair of detectors that detect both the reference light signal and the DC magnetically altered light signal and forms an electrical output signal. The electrical output signal is passed through an operational amplifier and phase sensitive detector outputting a signal that is representative of the change in magnetic field.

BRIEF DESCRIPTION OF THE DRAWINGS

FIG. 3(a) is a schematic of the transducer drive coil.

FIG. 3(b) is a schematic of the transducer drive coil mounted around the dual strip fiber optic magnetostrictive transducer.

DESCRIPTION OF THE PREFERRED EMBODIMENT

Magnetostrictive fiber optic magnetometers (also known as magnetic sensors, vector magnetometers or magnetostrictive transducers) operate as a vector device sensing the component of a magnetic field along a particular direction based upon the interaction between the magnetization and the deformation of a material having magnetostrictive properties. These fiber optic magnetic sensors systems employ a fiber interferometer in which the phase shift of light propagating in a fiber bonded to a magnetostrictive material is proportional to the square of the magnetic field.

The phase shift $\Phi$ induced in a length L of optical fiber bonded to a magnetostrictive metallic glass element is given by $$\Phi = kLCH_T^2$$

where $H_T$ is the total external magnetic field, C is the magnetostrictive parameter, k is the effective wave number $(2\pi n\lambda/\xi)$ in the fiber core with the refractive index n at laser wavelength $\xi$ and strain-optic correction factor $\lambda$ which equals $]1 - n^2\{(1-\mu)p_{12} - \mu p_{11}\}/2]$, where $\mu$ is the Poisson ratio and $p_{ij}$ are components of the strain optic tensor ($\xi = 0.78$ in silica glass fiber).

Typically, the total magnetic field is composed of three components:

$$H_T = H + h \sin \omega t + h_s \sin \Omega t$$

where H is the dc magnetic field, h is the high frequency carrier amplitude and $h_s$ is the amplitude of the low-frequency magnetic signal to be detected. Due to the quadratic dependence of the phase shift on total field, mixing occurs among the magnetic field components and information on low-frequency fields is contained in sidebands around the carrier. The information is then retrieved from the interferometer output by phase sensitive detection at the carrier frequency to recover the phase shift $$\Phi_{\omega \pm \Omega} = kLC_{107} hh_s$$

where $C_\omega$ is the magnetostrictive parameter at frequency $\omega$.

It has been found that the performance of a single axis magnetometer is limited by noise in the sidebands that reduces the signal-to-noise ratio (SNR) of the magnetic signal to be detected. The performance depends ultimately on the baseband noise level (interferometer noise floor), but degrades due to various noise sources that upconvert around the carrier residual. This residual signal is due to the non-ideal behavior of the transducer that does not follow the afore-described theory and exhibits at the carrier frequency in the presence of a zero dc magnetic field. Such behavior has been studied and reported, and is herein incorporated by reference, in K. P. Koo et al., *A fiber-optic dc magnetometer*, J. Lightwave Technol. Vol. LT-1, pp. 524-525 (1988), and K. P. Koo et al., *Low-frequency, submicrogauss fiber-optic magnetometer*, Electron. Lett., Vol. 23, pp. 985-987 (1987).

Figure 1:
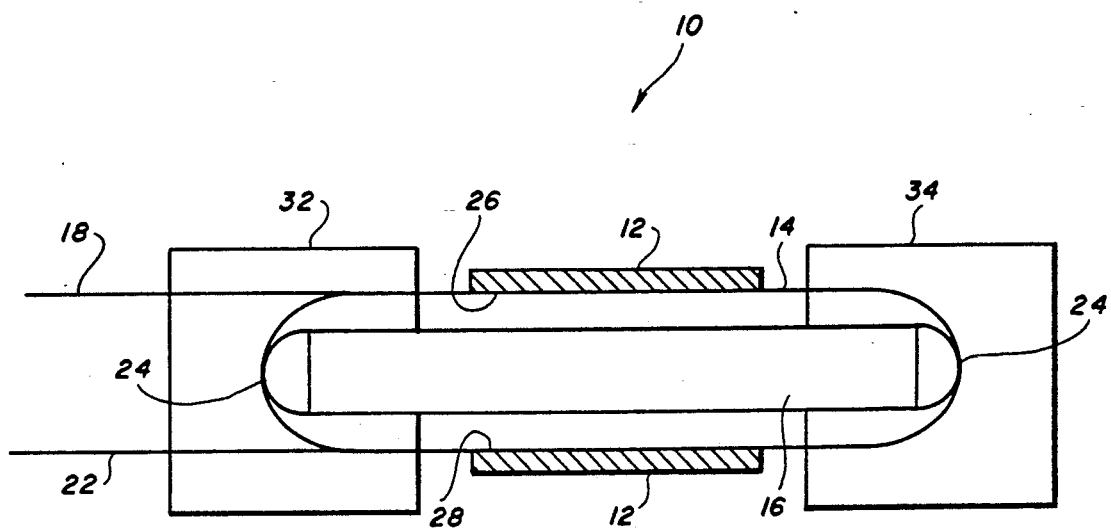
FIG. 1 is a schematic of the dual-strip fiber optic magnetostrictive transducer.

In the preferred embodiment, the dual-strip fiber optic magnetostrictive transducer 10, as shown in FIG. 1, consists of two transversely field-annealed magnetostrictive metallic strips 12 (e.g., an iron-boron alloy, MetGlas ®, manufacturers part no. 2605S-2, manufactured by Allied Chemical Corp. of Morristown, N.J.) bonded to a loop of fiber ribbon. Field-annealing enhances the sensitivity of the metallic strips to a magnetic field. The metallic strip is usually heat-treated or annealed at a temperature close to but below the Curie temperature in a vacuum in the presence of a magnetic field. The magnetic field should be strong enough to induce a magnetic anisotropy in the finished annealed material. Such annealing removes the structural stress in the material.

The sensitivity desired in the transducer determines the size of the metallic strips 12 and the length of optical fiber 14 to be utilized, i.e., for greater sensitivity larger metallic strips 12 and longer lengths of optical fiber 14 would be utilized. In the preferred embodiment a metallic strip 12 5 cm long by 5 mm wide by 25 μm thick is equated to a sensitivity of $10^{-6}$ Oe/$\sqrt{Hz}$ at 1 Hz.

The optical fiber is composed of a length of single mode optical fiber 14 (e.g., 80 μm diameter Corning Pay-out ® at 1.3 μm, manufactured by Corning Glass Corp. of Corning, N.Y.) having an input end 18 and an output end 22 is circularly wound so as to form a coil having three meters of active optical fiber. This coil of optical fiber 14 is then compressed so to form an optical fiber band when placed upon a rectangular beam, or bobbin, 16 approximately one-fourth inch in thickness, one centimeter wide and 9 centimeters in length having rounded ends 24. The bobbin 16 is constructed of fiber-glass epoxy (e.g., manufacturers part no. G-10, manufactured by Westinghouse Electric Corp. of Hampton, S.C.). At the rounded ends 24 of the bobbin 16, the optical fiber 14 is secured by epoxy (e.g., manufacturers part no. 61, manufactured by Norland of New Brunswick, N.J.). On the linear upper and lower sections 26 and 28, respectively, of the optical fiber 14, metallic strips 12 are attached utilizing an epoxy similar to that used in securing the optical fiber 14 to the bobbin 16 structure. This two-point mounting scheme gives rise to more predictable frequency response from transducer to transducer. The ends 24 of the bobbin 16 are secured to four end plates (two at each end) 32 and 34, respectively, perpendicular to the bobbin 16 and the end plate 32 and 34 are made of the same material as the bobbin 16. These end plates 32 and 34 provide mounting points for the transducer 10 when placed into a mounting structure (not shown) that will be discussed subsequently.

When the metallic strip 12 senses a change in magnetic field a magnetostrictive strain is generated that is conveyed to the optical fiber 14. The variation in strain within the optical fiber, when properly processed, indicates the change in magnetic field.

Figures 2, 2A:
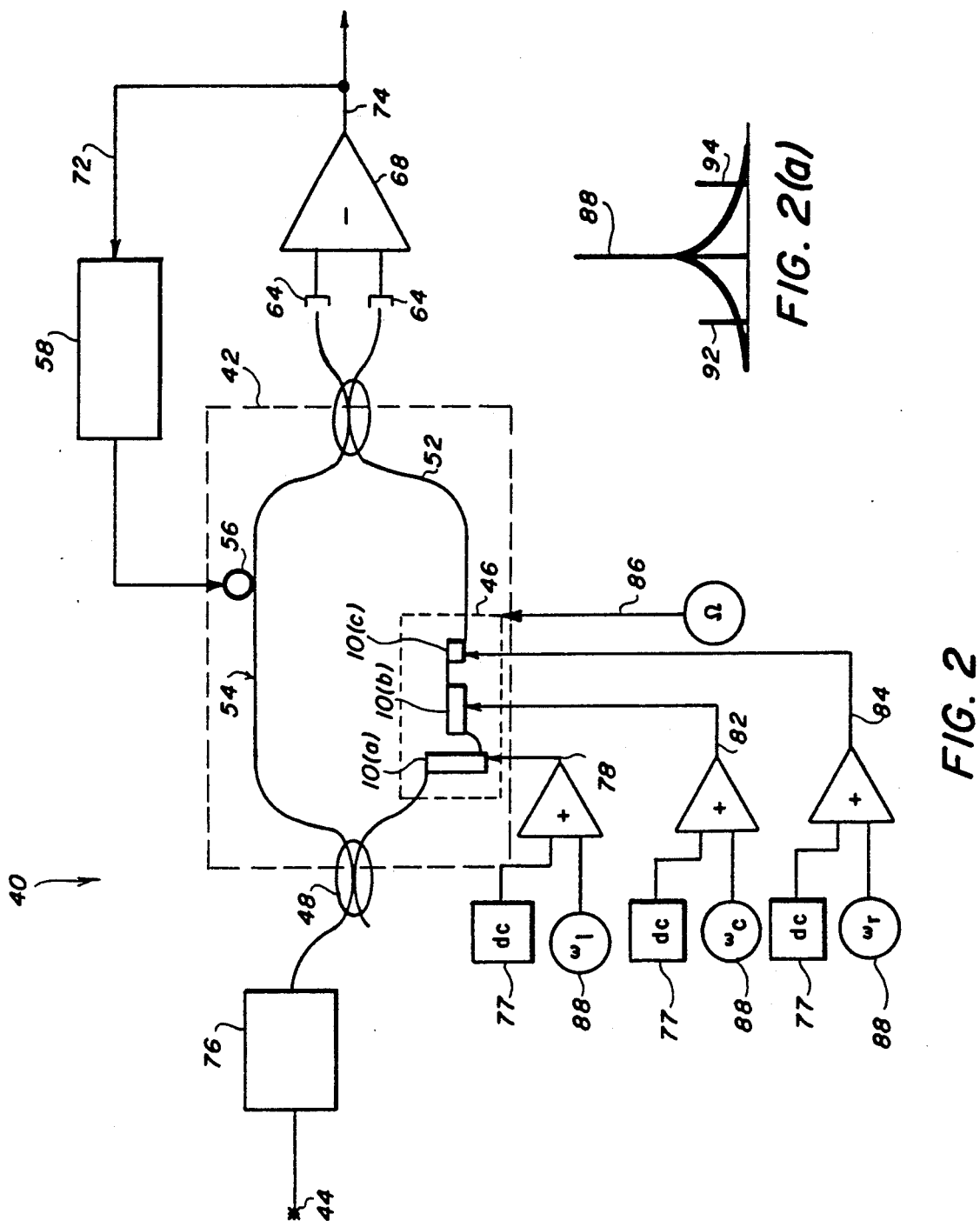
FIG. 2 is a schematic of the three-axis dual-strip fiber optic transducer system.
FIG. 2(a) is the depiction of the carrier frequency of the three-axis dual strip fiber optic transducer system and the sidebands generated.

A vector magnetometer 40, as shown in FIG. 2, is typically configured as a three-axis device to measure the magnetic field along three orthogonal directions, or X, Y and Z axes. Magnetostrictive fiber optic magnetometers 10 operate as a vector device, sensing the component of magnetic field along a particular axis.

Figure 2B:
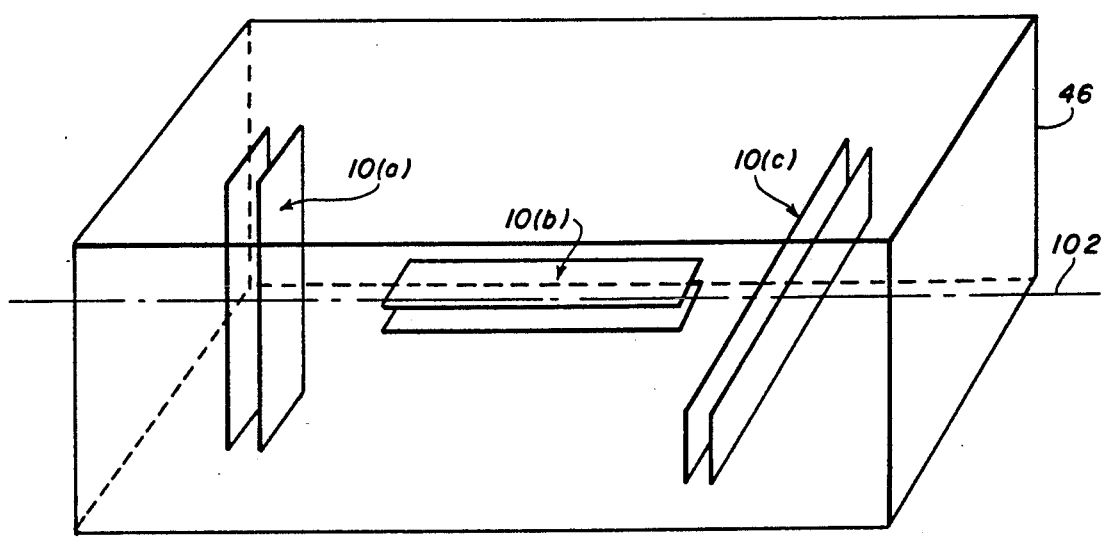
FIG. 2(b) is a schematic of the symmetrical, orthogonal mounting of the transducers in the sensor assembly.

In its preferred embodiment, the vector magnetometer system 40 consists of three-magnetostrictive transducers 10(a), 10(b) and 10(c) forming a sensor assembly 46 mounted in a single fiber Mach-Zehnder or Michelson interferometer 42 operating single mode at 1.3 μm. The interferometer 42 is powered by a Nd:YAG laser 44 (e.g., manufacturers part no. Series 120, manufactured by Lightwave Electronics Corp. of Mountain View, Calif.) at 1.3 μm, or other high coherence laser. The transducers 10(a), 10(b) and 10(c) are mounted in a symmetrical, orthogonal geometry, as shown in FIG. 2(b), inside a sensing assembly 46. The axis of symmetry 102 passes through the centroids of the transducers 10(a), 10(b) and 10(c) mounted within the sensor assembly 46. This mounting scheme advances the state-of-the-art of the sensor technology as shown in the prior art by greatly reducing the crosstalk between the transducers 10(a), 10(b) and 10(c). Further, improved directionality is achieved by the use of the metallic strips in the construction of the transducer 10(a), 10(b) and 10(c) in the system.

Directionality is measured as a function of various parameters of the magnetic drive, or dither. Because directionality degrades by approximately 30 dB compared to its value off resonance, the dither must be selected off resonance for maximum directionality. The best directionality corresponds to the operating point of the node in a nulled magnetic closed loop.

AC crosstalk is a function of various drive parameters. The transverse strain (strain at the transverse frequency, due to crosstalk) is independent of the magnitude of the residual signal at the magnetic carrier frequency. In the sensor assembly 46, the transverse strain of the central transducer 10(b) is essentially independent of the DC field applied to the transducer and, therefore, does not behave as externally applied transverse AC field mixing with the DC field to produce a strain at the AC frequency.

The light from the laser source 44 which is conducted through an isolator 76 (e.g., Faraday isolator) to a fiber coupler 48 which couples the light from the laser source into a sensing fiber arm 52 and a reference fiber arm 54. The isolator 76 prevents light from the interferometer 42 being reflected back to the laser source 44.

The sensing fiber arm 52 includes the sensing assembly 46 wherein the transducers 10(a), 10(b) and 10(c) are mounted in a symmetrical, orthogonal geometry so as to define the magnetometer X, Y, and Z axes. The transducers 10(a), 10(b) and 10(c) in the sensing assembly 46 are dithered to provide a carrier so that the DC or low frequency magnetic signals can be detected by looking at the response at the carrier frequency because of the nonlinear response of the magnetostrictive element.

Dithering is accomplished by applying to the transducers 10(a), 10(b) and 10(c) within the sensor package 46 a three composite signals 78, 82 and 84 which are generated by three operational amplifiers acting as magnetic drivers. Each composite signal 78, 82 and 84 consists of a DC signal 77 for adjusting or biasing the sensitivity of the transducer and a carrier signal ($\omega$) 88. To simulate a target, a test signal ($\Omega$) 86 is also input to the sensor package 46.

Referring to FIG. 2(a), when the carrier signal ($\omega$) 88 is mixed with the test signal ($\Omega$) 86, an upper sideband ($\omega + \Omega$) 92 and a lower sideband ($\Omega - \omega$) are generated producing a magnetic carrier signal modulating the optical signal in the sensing arm 52. The dithering methods are further discussed in the paper by Bucholtz et al., *Three-Axis, Optically-Powered Fiber Optic Magnetometer*, Conference Proceedings 1988 Laser and Electro-optic Society (LEOS) Meeting, IEEE Cat, No. 88CH2683-1, pp. 279–280, and which is herein incorporated by reference.

The magnetic dithering and bias signals are provided to each of the transducers by an transducer drive coil 98, referring to FIG. 3(a) and (b), consisting of one or more layers (optimally two) of magnetic wire (e.g., Manufacturers part no. 28 ga., manufactured by Belden of Geneva, Ill.) wound around a mounting structure which is cylindrical with square end caps. The mounting structure is made of the same fiberglass-epoxy material as the bobbin 16. Upon winding the magnet wire around the cylindrical portion of the mounting structure 96, the coil forms a solenoid so. The size of the magnetic wire forming the transducer drive coil 98 may range from 20 to 32 AWG, but may vary from this range because the gage of the wire is actually dependent upon the application and dynamic range desired for the application in which the transducer 10 is to be utilized.

Again referring to FIG. 2, the interferometer is modulated by wrapping the reference arm 54 around a PZT (Pb-Zr-Ti) cylinder 56 which is suitably excited by a quadrature control 58 for interferometer stabilization. The active stabilization of the reference arm signal by the PZT coil is similar in concept to that described in Statutory Invention Registration H94 (Koo), issued Jul. 1, 1986. Therein, a means for generating a magnetic carrier signal having a frequency greater than a magnetic measured field signal is applied to a magnetostrictive sensing element. A reference signal and measured signal are then sensed and an electrical feedback signal is extracted therefrom to achieve an interferometer output signal which is linearized with respect to the DC or low frequency magnetic signal.

The sensing arm 52 and reference arm 54 are coupled together with a fiber optic coupler 62 combine the laser light from the sensing arm 52 and reference arm 54 to form a composite optical signal for processing by the detecting means 64. The detecting means 64 detects both the reference light signal and the DC (or low frequency) magnetically altered light signal and forms an electrical output signal, each electrical output signal being 180° out of phase with the other. These electrical output signals are then applied to the operational amplifier 68, operating in a differential mode, where interferometer output signal 74 appears as a double sideband signal to be processed by respective lock-in amplifiers (not shown) in their phase sensitive detection mode and thus separate the magnetically induced interferometer signals at the respective frequencies of the signal generators (not shown). This detection scheme is described in the U.S. patent application Ser. No. 07/767,955, Koo et al., filed Sep. 30, 1991 and is herein incorporated by reference. Therein the lock-in amplifiers serve as a separating means (known as phase sensitive detection) for separating respective DC (low frequency) magnetically induced interferometer signals at respective ones of the frequencies and for producing respective output signals indicative thereof for display on an oscilloscope, or other indicator device.

The interferometer output signal 74 is also provided as a control signal 72 to the quadrature control 58 for controlling the PZT's 56 phase tracker in the reference arm 54.

A magnetometer utilizing the dual-strip fiber-optic magnetostrictive transducer may be produced in such a configuration that it is sensitive enough to detect metallic objects at the sea bottom or minute variations in the earth's magnetic field. The versatility of the dual-strip magnetostrictive fiber-optic transducer lies in the fact that its sensitivity is regulated by the physical size of the transducer, the more optical-fiber that is in contact with the metallic glass, the more sensitive the transducer is without having the large bulk normally associated with fiber optic transducers of a similar sensitivity. Further, the method of construction of the dual-strip optical-fiber magnetostrictive transducer 10, described in the preferred embodiment, results in the individual transducers having a predictable frequency response and high sensitivity.

Although the invention has been described in relation to exemplary preferred embodiments thereof, it will be understood by those skilled in this art that still other variations and modifications can be effected in these preferred embodiments without detracting from the scope and spirit of the invention.

What is claimed is:

1. A dual-strip fiber optic magnetostrictive transducer system comprised of:
   a predetermined length of optical fiber wound in a circular form;
   a rectangular bobbin having a first and a second end with rounded edges and a vertical first and second sides within the circular optical fiber thereby forming a first and second horizontal linear portions of the optical fiber;
   a two-point mounting scheme formed by securing the optical fiber at the first and second rounded ends of the bobbin;
   a first and second field-annealed magnetostrictive glass strip secured to the first and second horizontal linear portion, respectively, of the optical fiber;
   end plates attached at the first and second ends of the bobbin on the first and second sides of the bobbin to form mounting surfaces; and
   a mounting structure wherein the bobbin is mounted.

2. A system, as in claim 1, wherein the means for securing the first and second field-annealed magnetostrictive glass strips are secured to the optical fiber by an epoxy.

3. A system, as in claim 1, wherein the end plates are secured to the first and second sides of the bobbin is an epoxy.

4. A system, as in claim 1, further comprising:
a laser source for producing a optical laser light;
a coupler for dividing the optical laser light into a first and second optical beam;
an interferometer having a reference arm for receiving and conducting the first optical beam and a sensing arm for receiving and conducting the second optical beam;
a coil of optical fiber wrapped around a PZT cylinder located in the reference arm;
control means for applying a signal through the PZT cylinder to modulate the first optical beam in the reference arm for interferometer stabilization;
means for detecting low frequency magnetic signals in the sensing arm;
a coupler for combining the first and second optical light beam into a composite optical laser light beam, and having an output comprised of a first and second composite optical laser light beam 180° out of phase;
a first and second detectors for converting said first and second composite optical laser light beams into an electrical signal; and
an operational amplifier for converting the electrical signals from the first and second detectors into an output signal.

5. A system, as in claim 4, wherein the laser source is a high coherence laser source.

6. A system, as in claim 5, wherein the coherent laser source is a Nd:YAG laser.

7. A system, as in claim 4, wherein the means for detecting low frequency magnetic signals is a sensing assembly.

8. A system, as in claim 7, wherein the sensing assembly is comprised of a multiple of dual-strip fiber optic magnetostrictive transducers mounted in symmetrical orthogonal geometry;

9. A system, as in claim 1, wherein the bobbin and end plates are made of fiberglass epoxy.

10. A system, as in claim 1, wherein said mounting structure is made of fiberglass epoxy.

11. A system, as in claim 4, wherein said interferometer is a Mach-Zehnder interferometer.

12. A system, as in claim 4, wherein the interferometer is a Michelson interferometer.

13. A system, as in claim 4, wherein the interferometer is selected from a group consisting of a Mach-Zehnder interferometer, a Michelson interferometer or similar interferometer.

14. A system, as in claim 8, wherein said multiple of transducers are mounted in the X, Y, and Z axes.

15. A system, as in claim 8, further including a dithering means for dithering the multiple of transducers to generate a carrier signal and an upper and lower sideband signal.

16. A system as in claim 15, wherein the dithering means is comprised of:
one or more windings of wire around the mounting structure to form a solenoid;
means for generating a composite signal comprised of a DC signal and a carrier signal;
means for generating a test signal; and
applying the composite signal and test signal to the windings of the solenoid.

17. A system, as in claim 4, wherein said control means is a quadrature control.

18. A method for constructing a dual-strip fiber optic magnetostrictive transducer comprising the steps of:
winding a predetermined length of optical fiber to form a coil;
attaching the optical fiber coil to a rectangular bobbin having a first and second rounded end to form a first and second linear portion of optical fiber between the first and second rounded end of the bobbin;
attaching a field-annealed magnetostrictive metallic strip to the first and second linear portion of the optical fiber;
attaching a multiple of end plates to the first and second rounded ends of the bobbin perpendicular to the flat rectangular plane of the bobbin; and,
mounting the bobbin in a mounting structure.

* * * * *